(12) United States Patent
Jeng et al.

(10) Patent No.: US 8,273,445 B2
(45) Date of Patent: Sep. 25, 2012

(54) REINFORCED ASSEMBLY CARRIER

(75) Inventors: Ren Yih Jeng, Jhongli (TW); Kuang Hsiung Chen, Taoyuan (TW); Chun Hung Hsu, Fusing Township (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 1122 days.

(21) Appl. No.: 12/135,607

(22) Filed: Jun. 9, 2008

(65) Prior Publication Data

US 2009/0252931 A1 Oct. 8, 2009

(30) Foreign Application Priority Data

Apr. 2, 2008 (TW) ................. 97111987 A

(51) Int. Cl.
*B32B 23/02* (2006.01)
*H01L 23/28* (2006.01)

(52) U.S. Cl. .................. 428/192; 428/156; 257/787

(58) Field of Classification Search .................. 428/192, 428/156; 257/730, 787, E21.499, 666, 708, 257/723, 783
See application file for complete search history.

(56) References Cited

U.S. PATENT DOCUMENTS

| | | | |
|---|---|---|---|
| 5,841,194 A * | 11/1998 | Tsukamoto | 257/729 |
| 6,020,221 A | 2/2000 | Lim et al. | |
| 6,458,626 B1 * | 10/2002 | Huang et al. | 438/112 |
| 6,486,554 B2 * | 11/2002 | Johnson | 257/738 |
| 7,521,291 B2 * | 4/2009 | Masumoto | 438/113 |
| 7,880,276 B2 * | 2/2011 | Nishimura et al. | 257/667 |
| 2003/0092205 A1 * | 5/2003 | Wu et al. | 438/15 |

FOREIGN PATENT DOCUMENTS

| | | |
|---|---|---|
| CN | 101150095 A | 3/2008 |
| TW | 200741902 | 11/2007 |

* cited by examiner

*Primary Examiner* — Catherine A Simone

(57) ABSTRACT

A reinforced assembly carrier is provided. A supporting frame made of molding compound is formed on the edge area of the upper surface and/or on the edge area of the lower surface of the assembly carrier thereby enhancing the mechanical strength of the assembly carrier.

18 Claims, 6 Drawing Sheets

REINFORCED ASSEMBLY CARRIER

CROSS REFERENCE TO RELATED APPLICATION

This application claims the priority benefit of Taiwan Patent Application Serial Number 097111987 filed Apr. 2, 2008, the full disclosure of which is incorporated herein by reference.

BACKGROUND OF THE INVENTION

1. Field of the Invention

The invention relates to an assembly carrier, a method for manufacturing assembly carriers and a method for manufacturing semiconductor packages and more particularly, to a reinforced assembly carrier, a method for manufacturing reinforced assembly carriers and a method for utilizing the above reinforced assembly carrier to manufacture semiconductor packages 2. Description of the Related Art Referring to FIG. 1, a conventional assembly carrier 100 has one or more package units 110 defined thereon. An edge area 120 is defined at the periphery of the assembly carrier 100 and adapted for conveying, positioning and clamping the assembly carrier 100 during the process of packaging. However, when the assembly carrier 100 becomes more and more thin for the requirement of miniaturization, the assembly carrier 100 will be easy to be bent and therefore be prone to jamming in machines during conveyance. This will lead to the damage of the assembly carrier 100. Moreover, when the assembly carrier 100 is die-bonded or wire-bonded, there is usually a need to heat the assembly carrier 100 to facilitate the bonding process. However, heating will cause the assembly carrier 100 to be prone to warpage and/or deformation when the assembly carrier 100 is very thin. This will have an adverse influence on the reliability and yield of production.

Accordingly, there exists a need to provide a reinforced assembly carrier to solve the above-mentioned problems.

SUMMARY OF THE INVENTION

It is an object of the present invention to provide a reinforced assembly carrier that has better mechanical properties.

In order to achieve the above object, the reinforced assembly carrier according to the present invention includes an assembly carrier having a first surface, a second surface opposing to the first surface and a plurality of side surfaces connecting the first and second surfaces. A supporting frame made of sealant, such as molding compound is formed on the edge area of the upper surface and/or on the edge area of the lower surface of the assembly carrier with a molding process thereby enhancing the mechanical strength of the assembly carrier.

It is another object of the present invention to provide a method for manufacturing reinforced assembly carriers.

In order to achieve the above object, the method for manufacturing reinforced assembly carriers according to the present invention is to utilize a molding process to form the supporting frames on the assembly carriers.

It is a further object of the present invention to provide a method for manufacturing semiconductor packages.

In order to achieve the above object, the method for manufacturing semiconductor packages according to the present invention is to use the above reinforced assembly carrier of the present invention as an assembly carrier. Afterward, several semiconductor package processes including die bonding, wire bonding, molding and singulation processes are performed on the reinforced assembly carrier thereby forming semiconductor packages.

According to the reinforced assembly carrier of the present invention, the supporting frame can improve the mechanical strength of the assembly carrier. Therefore, the problems of that the assembly carrier is prone to jamming and warpage due to thin thickness can be solved.

The foregoing, as well as additional objects, features and advantages of the invention will be more readily apparent from the following detailed description, which proceeds with reference to the accompanying drawings.

BRIEF DESCRIPTION OF THE DRAWINGS

FIG. 7 illustrates the mold for forming the supporting frame of FIG. 3a.

DETAILED DESCRIPTION OF THE PREFERRED EMBODIMENT

Figure 1:
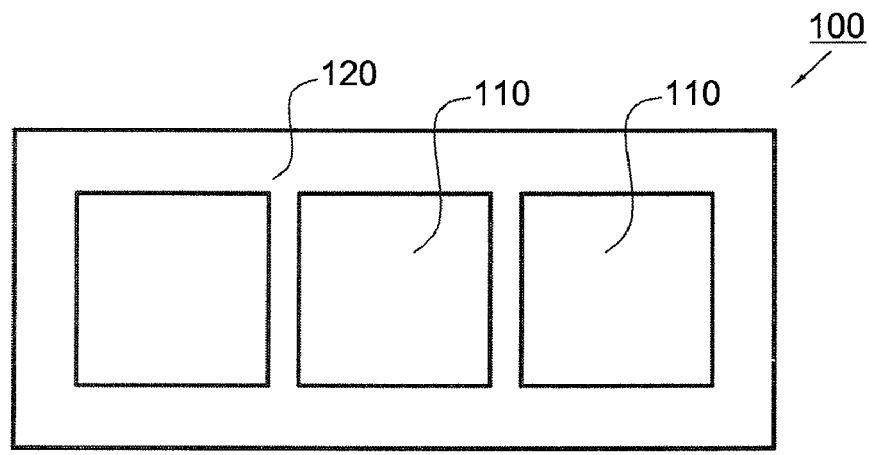
FIG. 1 illustrates a conventional assembly carrier.
Figure 2A:
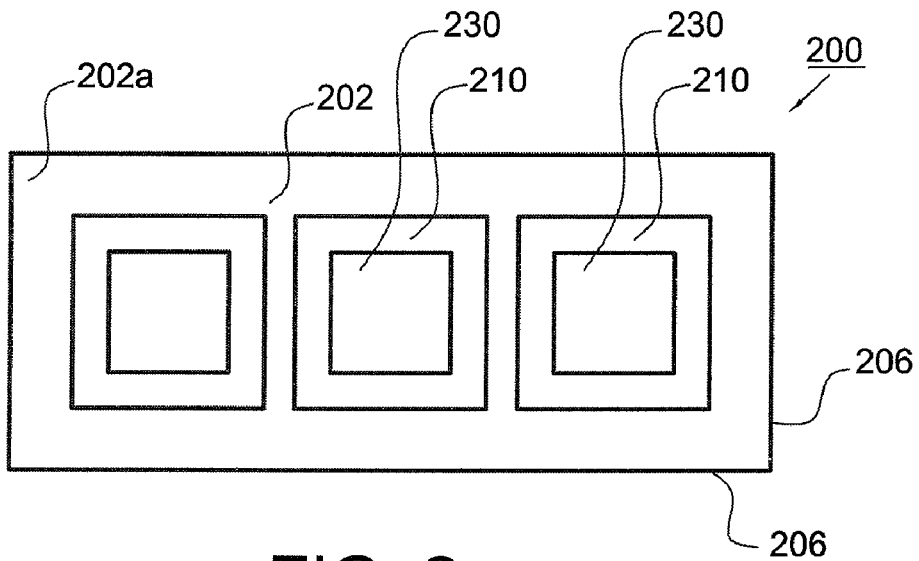
FIG. 2a is a top view of the assembly carrier for manufacturing the reinforced assembly carrier of the present invention.
Figure 2B:
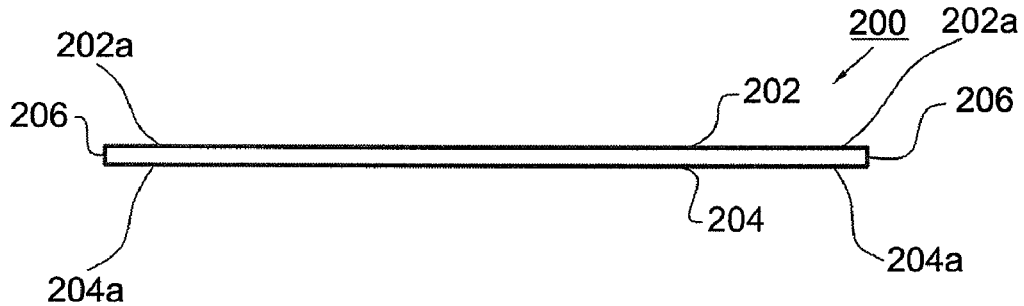
FIG. 2b is a cross-sectional view of the assembly carrier for manufacturing the reinforced assembly carrier of the present invention.

Referring to FIGS. 2a and 2b, the method for manufacturing a reinforced assembly carrier according to the present invention is first to provide an assembly carrier 200, such as a leadframe or a substrate. The substrate can be a rectangular substrate strip with a thickness of below 0.2 mm and have a plurality of substrate units 210 defined thereon. The assembly carrier 200 includes an upper surface 202, a lower surface 204 and a plurality of side surfaces 206 connecting the upper and lower surfaces 202, 204. The upper surface 202 can be the chip bonding surface of the assembly carrier 200 and the lower surface 204 is the backside of the assembly carrier 200. Moreover, a chip disposing area 230 is defined in the each substrate unit 210 on the upper surface 202 of the assembly carrier 200. An edge area 202a is defined on the upper surface 202 of the assembly carrier 200 and surrounds the chip disposing areas 230. An edge area 204a is defined on the lower surface 204 of assembly carrier 200 and corresponding to the edge area 202a of the upper surface 202.

Figure 3A:
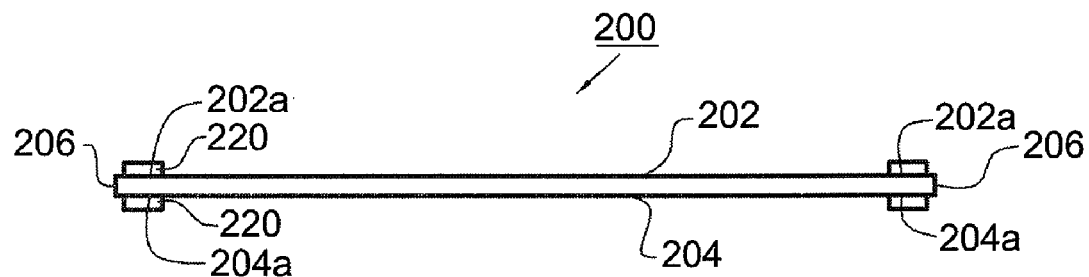
FIGS. 3a to 3d illustrate various aspects of the reinforced assembly carrier of the present invention.
Figure 3B:
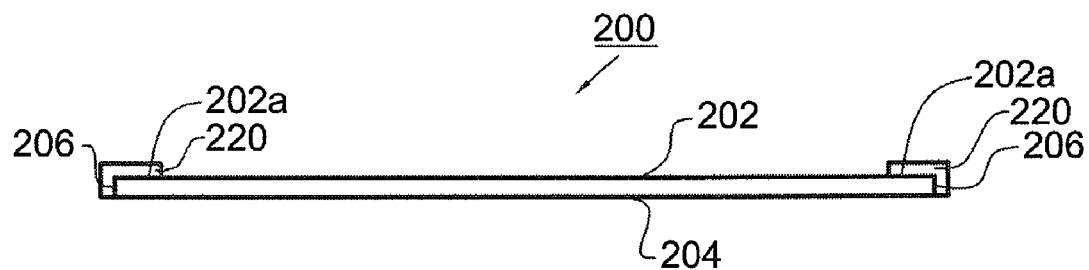
Figure 3C:
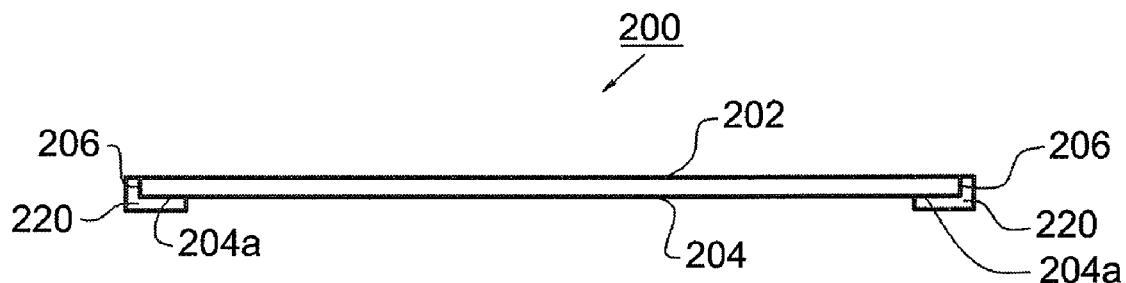
Figure 3D:
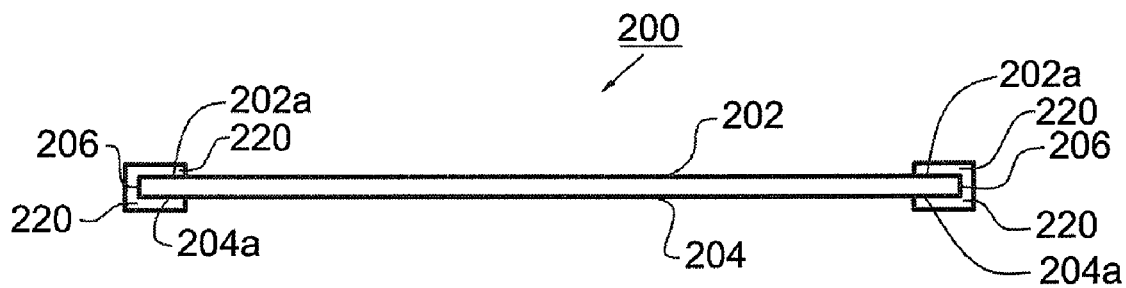

Afterward, referring to FIGS. 3a to 3d, a supporting frame 220 having a width ranging from 2 mm to 5 mm and made of sealant, such as molding compound is formed on the edge area 202a of the upper surface 202 and/or on the edge area 204a of the lower surface 204 of the assembly carrier 200 with a molding process (see FIG. 3a). In addition, the supporting frame 220 can also be formed on the edge area 202a of the upper surface 202 and the side surfaces 206 of the assembly carrier 200 (see FIG. 3b). Similarly, the supporting frame 220 can be formed on the edge area 204a of the lower surface 204 and the side surfaces 206 of the assembly carrier 200 (see FIG. 3c). The supporting frame 220 can also be formed on the edge area 202a of the upper surface 202, the edge area 204a of the lower surface 204 and the side surfaces 206 (see FIG. 3d).

Figure 4A:
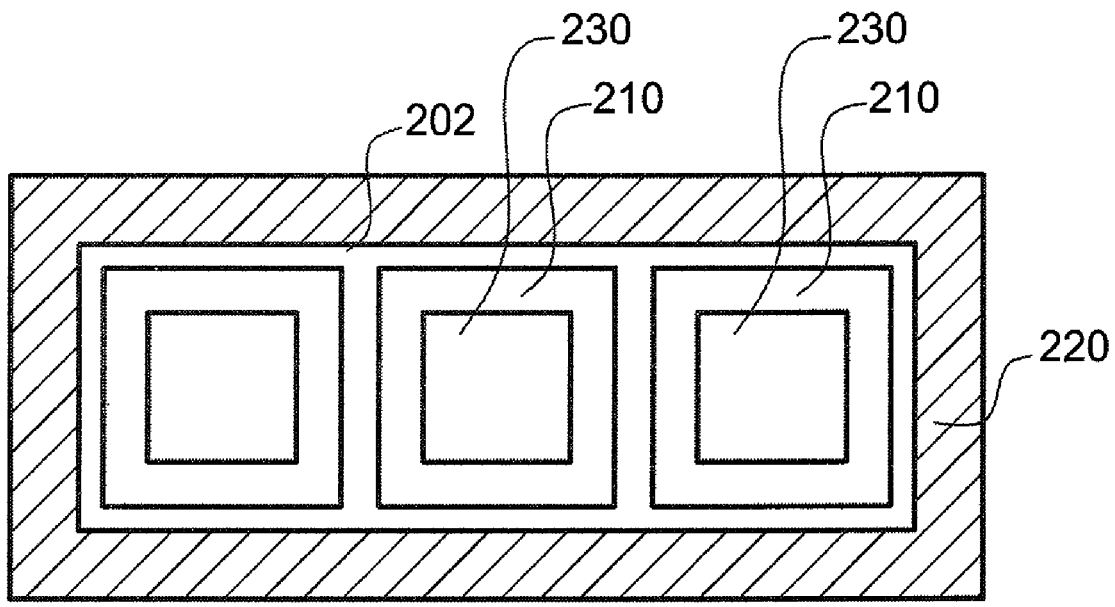
FIGS. 4a and 4b are top views of various aspects of the reinforced assembly carrier of the present invention, wherein the supporting frames have closed-ring structures.
Figure 4B:
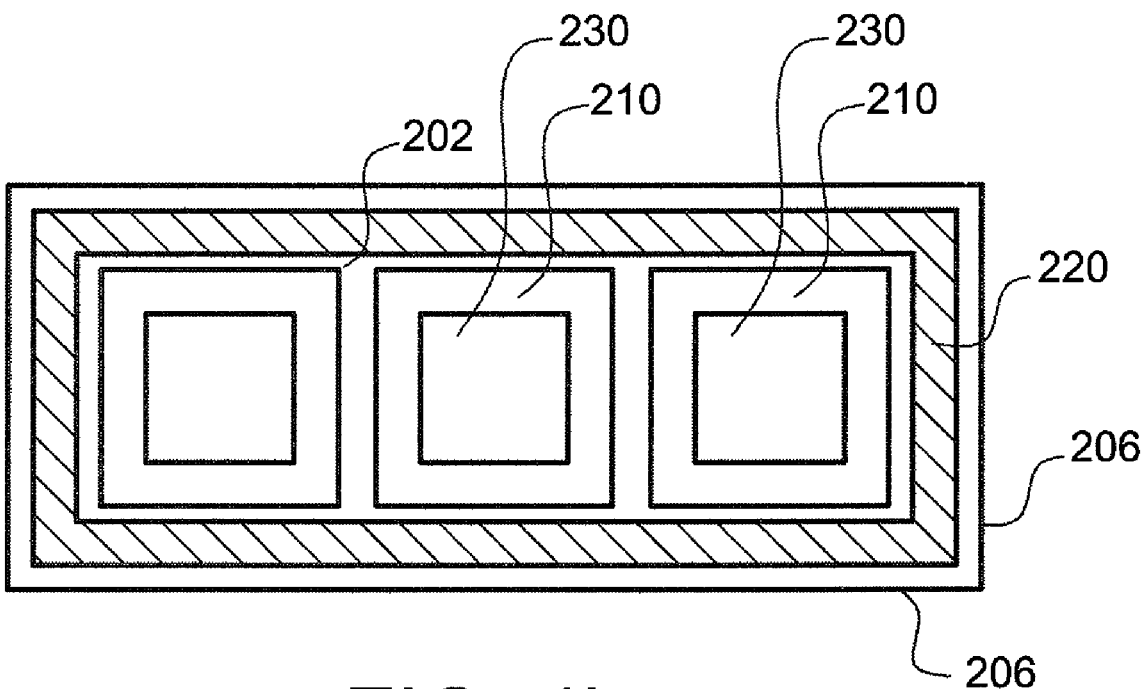
Figure 5A:
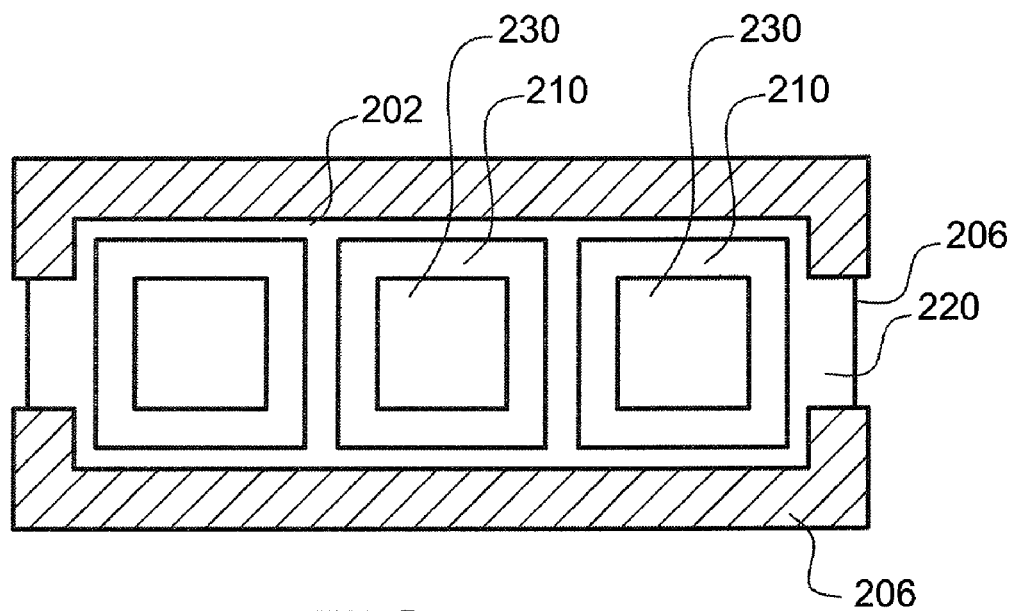
FIGS. 5a and 5b are top views of various aspects of the reinforced assembly carrier of the present invention, wherein the supporting frames have discontinuous structures.
Figure 5B:
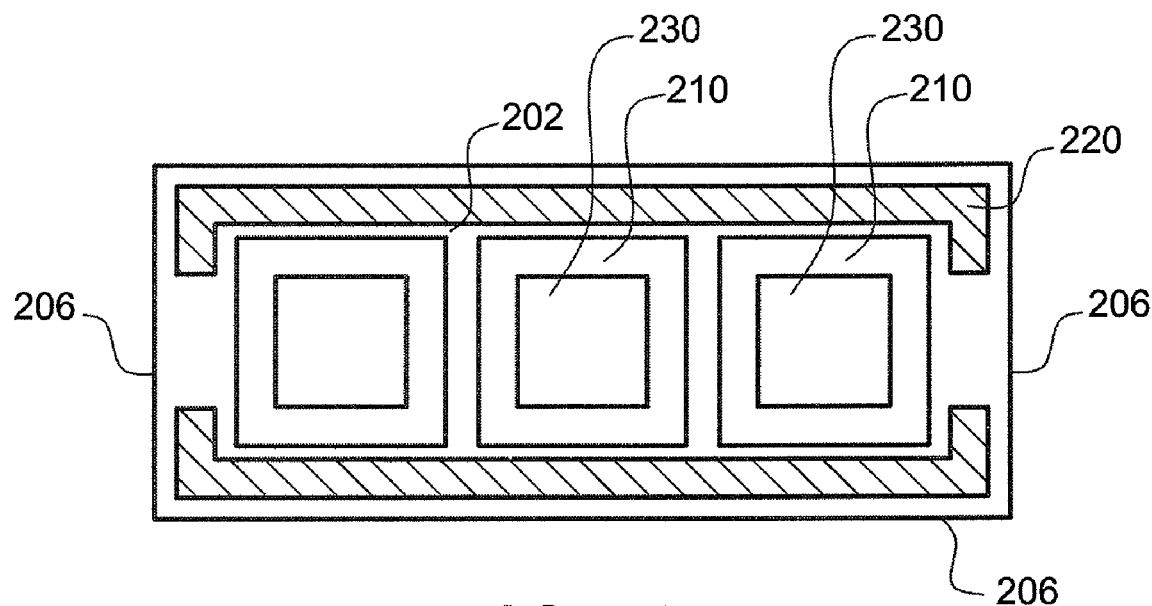
Figure 6:
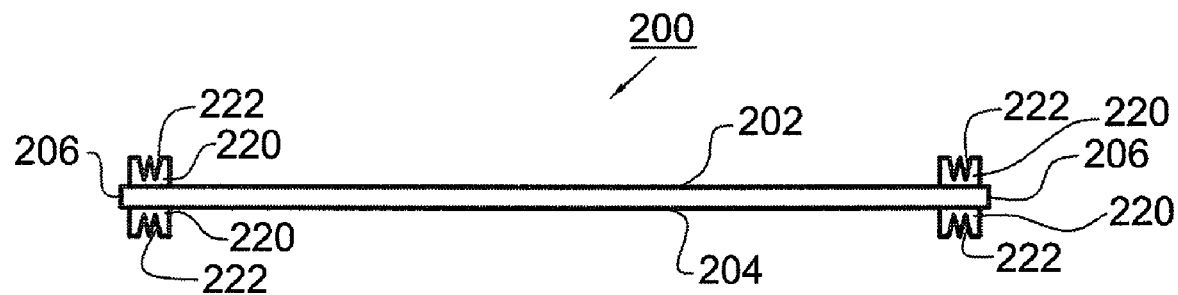
FIG. 6 is a cross-sectional view of the reinforced assembly carrier of the present invention, wherein the supporting frame has a sawtooth-shaped surface.

Referring to FIGS. 4a and 4b, the supporting frame 220 formed on the upper surface 202 and/or the lower surface 204 can have a continuous structure. Specifically, the supporting frame 220 can has a closed-ring structure. In addition, referring to FIGS. 5a and 5b, the supporting frame 220 formed on the upper surface 202 and/or the lower surface 204 can also have a discontinuous structure. Specifically, the supporting frame 220 includes several discrete sections. Besides, the supporting frame 220 formed on the edge areas 202a and 204a in FIG. 3a can have a rectangular or trapezoid cross section. Moreover, referring to FIG. 6, in order to have better mechanical properties, the supporting frame 220 can have a sawtooth-shaped surface.

Figure 7:
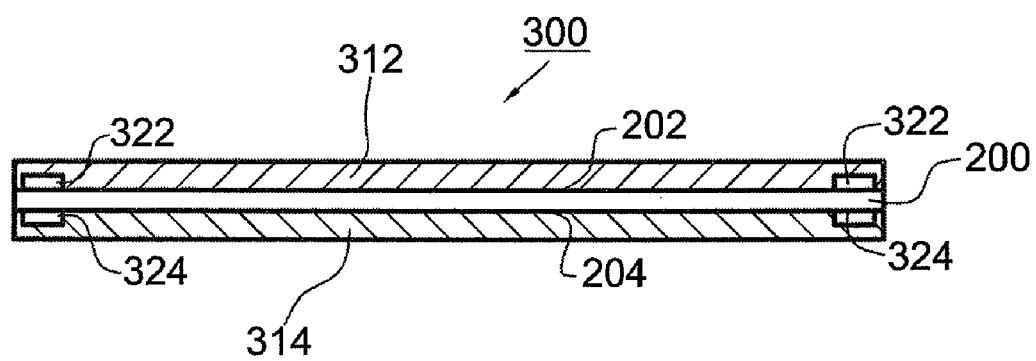
Figure 8A:
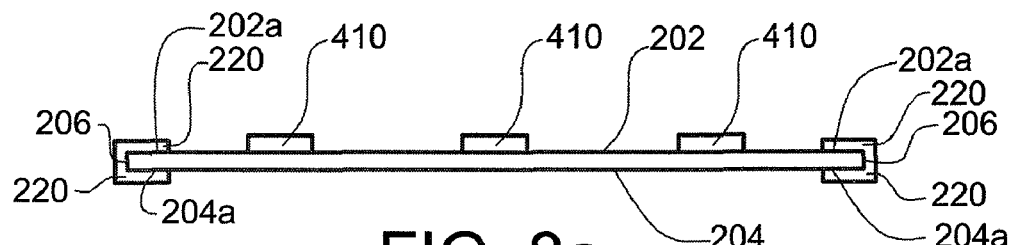
FIGS. 8a to 8e illustrate the method for manufacturing semiconductor packages according to the present invention.
Figure 8B:
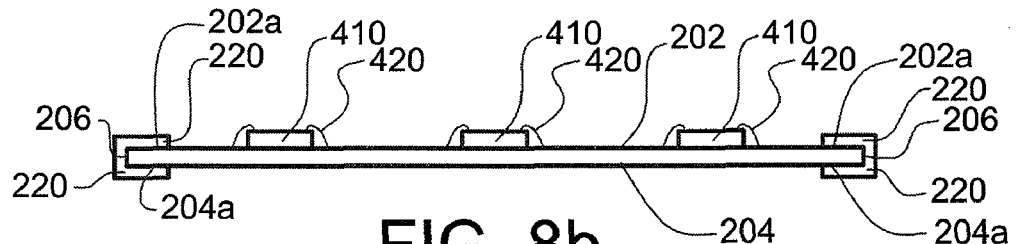
Figure 8C:
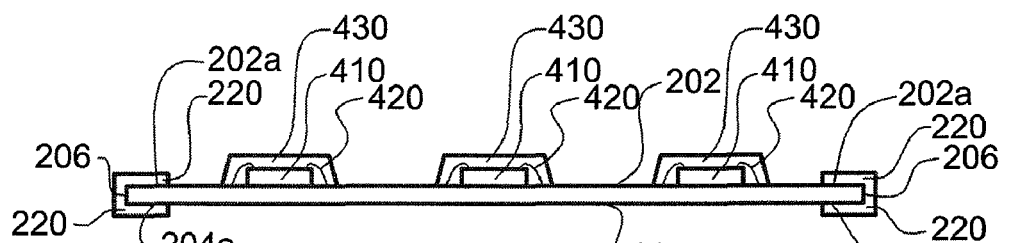
Figure 8D:
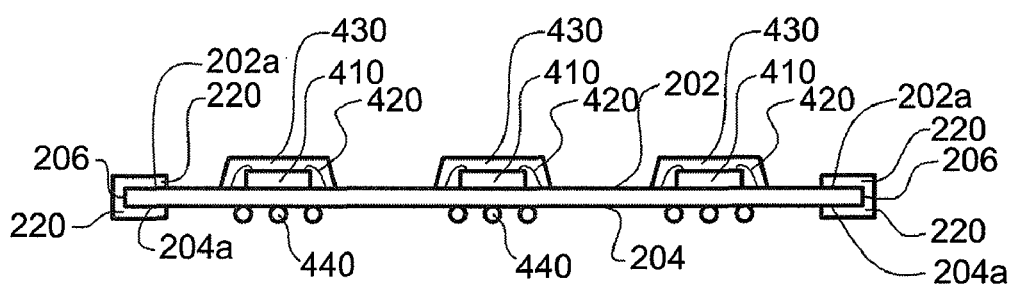
Figure 8E:
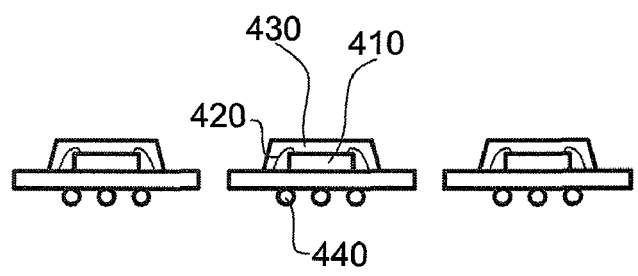

The supporting frame of the reinforced assembly carrier of the present invention can be formed with a molding process. More specifically, the supporting frame is formed by injecting a molten molding compound into the cavity of a mold that has a shape corresponding to that of the supporting frame. For example, referring to FIG. 7, a mold 300 can be used to form the supporting frame 220 of FIG. 3a. The mold 300 includes an upper mold 312 and a lower mold 314. The upper mold 312 has a cavity 322 corresponding to the supporting frame 220 positioned on the upper surface 202 of the assembly carrier 200. Similarly, the lower mold 314 has a cavity 324 corresponding to the supporting frame 220 positioned on the lower surface 204 of the assembly carrier 200. When it is desired to form the supporting frame 220 of FIG. 3a, the upper mold 312 is disposed on the upper surface 202 of the assembly carrier 200 and the lower mold 314 is disposed on the lower surface 204 of the assembly carrier 200. Subsequently, a molten molding compound is injected into the cavities 322 and 324. After the molding compound is hardened, the supporting frame 220 of FIG. 3a is formed. Similarly, the supporting frames 220 of FIGS. 3b to 6 can be formed by the molds with cavities corresponding to the supporting frames 220 to be formed. Any further illustrations of these molds are omitted.

Referring to FIGS. 8a to 8e, the reinforced assembly carrier of the present invention can be used to manufacture semiconductor packages with several semiconductor package processes. For example, a plurality of chips 410 is bonded to the chip disposing areas 230 of the assembly carrier 200, respectively (see FIG. 8a). A plurality of bonding wires 420 is then used to electrically connect the chips 410 to the assembly carrier 200 (see FIG. 8b). Afterward, sealants 430 are formed on the upper surface 202 of the assembly carrier 200 to encapsulate the chips 410 and bonding wires 420 (see FIG. 8c). When the desired semiconductor packages are ball grid array (BGA) packages, a plurality of solder balls 440 is required to be formed on the lower surface 204 of the assembly carrier 200 to enable the chips 410 to be electrically connected to external circuitry (see FIG. 8d). Finally, the supporting frame 220 is removed from the assembly carrier 200 by cutting and the assembly carrier 200 is singulated to form individual semiconductor packages with the chips 410 (see FIG. 8e). In addition to ball grid array packages, the reinforced assembly carrier of the present invention can also be used to manufacture land grid array (LGA) packages or quad flat non-leaded (QFN) packages. It is to be noted that although the present embodiment are illustrated with that a plurality of discrete sealants 430 is respectively formed on the package areas of the assembly carrier 200 to encapsulate the elements thereon, all the chips 410 and bonding wires 420 can be encapsulated in a continuous sealant. Since the method of molding is well-known in the art, any further illustrations are omitted.

According to the reinforced assembly carrier of the present invention, the supporting frame can improve the mechanical strength of the assembly carrier. Therefore, the above problems of that the assembly carrier is prone to jamming and warpage due to thin thickness can be solved. Moreover, since supporting frame is positioned on only the edge area of the assembly carrier, the central area of the assembly carrier is not occupied and can still provide for subsequent die bonding, wire bonding, molding and singulation processes. Furthermore, the edge portion of the assembly carrier together with the supporting frame will be cut off and discarded after individual semiconductor packages are obtained. There is no need to waste time to retrieve the worthless supporting frame for reuse.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A reinforced assembly carrier, comprising:
   an assembly carrier having a first surface, a second surface opposing to the first surface and a plurality of side surfaces connecting the first and second surfaces, the first surface having at least one chip disposing area and an edge area surrounding the chip disposing area, the second surface has an edge area corresponding to the edge area of the first surface;
   a first sealant molded on the edge area of the first surface and enhancing the mechanical strength of the assembly carrier, wherein the first sealant has a sawtooth-shaped surface; and
   a second sealant molded on the edge area of the second surface and enhancing the mechanical strength of the assembly carrier, wherein the second sealant has a sawtooth-shaped surface.

2. The reinforced assembly carrier as claimed in claim 1, wherein the first sealant is further formed on the side surfaces of the assembly carrier.

3. The reinforced assembly carrier as claimed in claim 2, wherein the first sealant is further formed on the edge area of the second surface.

4. The reinforced assembly carrier as claimed in claim 1, wherein the first and second sealants have rectangular cross sections.

5. The reinforced assembly carrier as claimed in claim 1, wherein the first and second sealants have trapezoid cross sections.

6. The reinforced assembly carrier as claimed in claim 1, wherein the assembly carrier is a substrate or a leadframe.

7. The reinforced assembly carrier as claimed in claim 1, wherein the first sealant has a closed-ring structure.

8. The reinforced assembly carrier as claimed in claim 1, wherein the first sealant has a plurality of discrete sections.

9. The reinforced assembly carrier as claimed in claim 6, wherein the assembly carrier has a thickness of below 0.2 mm.

10. The reinforced assembly carrier as claimed in claim 1, wherein the first sealant has a width ranging from 2 mm to 5 mm.

11. The reinforced assembly carrier as claimed in claim 1, wherein the first sealant is inwardly spaced from the side surfaces of the assembly carrier.

12. The reinforced assembly carrier as claimed in claim 1, wherein the second sealant is inwardly spaced from the side surfaces of the assembly carrier.

13. The reinforced assembly carrier as claimed in claim 3, wherein the first sealant has a U-shaped cross section.

14. The reinforced assembly carrier as claimed in claim 2, wherein the first sealant entirely covers the side surfaces of the assembly carrier.

15. The reinforced assembly carrier as claimed in claim 8, wherein the first sealant has two discrete sections that are symmetrical to each other.

16. The reinforced assembly carrier as claimed in claim 15, wherein the two discrete sections are U-shaped.

17. The reinforced assembly carrier as claimed in claim 1, wherein the second sealant is symmetrical to the first sealant.

18. A reinforced assembly carrier, comprising:
an assembly carrier having a first surface, a second surface opposing to the first surface and a plurality of side surfaces connecting the first and second surfaces, the first surface having at least one chip disposing area and an edge area surrounding the chip disposing area, the second surface has an edge area corresponding to the edge area of the first surface;
a first sealant molded on the edge area of the first surface and enhancing the mechanical strength of the assembly carrier, wherein the first sealant has a sawtooth-shaped surface; and
a second sealant molded on the edge area of the second surface and enhancing the mechanical strength of the assembly carrier, wherein the second sealant is symmetrical to the first sealant.

* * * * *